US009799559B1

(12) United States Patent
Siddiqui et al.

(10) Patent No.: US 9,799,559 B1
(45) Date of Patent: Oct. 24, 2017

(54) METHODS EMPLOYING SACRIFICIAL BARRIER LAYER FOR PROTECTION OF VIAS DURING TRENCH FORMATION

(71) Applicants: GLOBALFOUNDRIES Inc., Grand Cayman (KY); International Business Machines Corporation, Armonk, NY (US)

(72) Inventors: Shariq Siddiqui, Albany, NY (US); Frank W. Mont, Troy, NY (US); Xunyuan Zhang, Albany, NY (US); Brown Peethala, Albany, NY (US); Douglas M. Trickett, Altamont, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/158,827

(22) Filed: May 19, 2016

(51) Int. Cl.
| | |
|---|---|
| *H01L 21/768* | (2006.01) |
| *H01L 21/44* | (2006.01) |
| *H01L 21/311* | (2006.01) |
| *H01L 21/302* | (2006.01) |
| *H01L 21/475* | (2006.01) |
| *H01L 21/469* | (2006.01) |
| *H01L 23/522* | (2006.01) |

(Continued)

(52) U.S. Cl.
CPC .... *H01L 21/7688* (2013.01); *H01L 21/76843* (2013.01); *H01L 21/76865* (2013.01); *H01L 21/76883* (2013.01); *H01L 23/528* (2013.01); *H01L 23/5226* (2013.01); *H01L 23/53219* (2013.01); *H01L 23/53223* (2013.01); *H01L 23/53228* (2013.01); *H01L 23/53257* (2013.01)

(58) Field of Classification Search
CPC ......... H01L 21/76807; H01L 21/31144; H01L 21/76808; H01L 23/481; H01L 21/30604; H01L 21/31111
USPC ................. 257/E21.579, 408, 750–753, 774; 438/618, 624, 637–639
See application file for complete search history.

(56) References Cited

U.S. PATENT DOCUMENTS

| | | | |
|---|---|---|---|
| 9,263,327 B2 | 2/2016 | Zhang et al. | |
| 2005/0275005 A1* | 12/2005 | Choi ................. | H01L 21/76841 257/300 |

(Continued)

*Primary Examiner* — Kimberly Rizkallah
*Assistant Examiner* — Brian Turner
(74) *Attorney, Agent, or Firm* — Heslin Rothenberg Farley & Mesiti PC

(57) ABSTRACT

A method includes, for example, providing an intermediate semiconductor structure comprising a metallic layer, a patternable layer disposed over the metallic layer, and a hard mask disposed over the patternable layer, the intermediate semiconductor structure comprising a plurality of vias extending through the hard mask onto the metallic layer, depositing a sacrificial barrier layer over the intermediate semiconductor structure and in the plurality of vias, removing a portion of the sacrificial barrier layer between the plurality of vias while maintaining a portion of the sacrificial barrier layer in the plurality of vias, forming a trench in the patternable layer between the removed portion of the sacrificial barrier layer and the plurality of vias, and removing the remaining portions of the sacrificial barrier layer from the plurality of vias.

20 Claims, 6 Drawing Sheets

(51) Int. Cl.
*H01L 23/528* (2006.01)
*H01L 23/532* (2006.01)

(56) References Cited

U.S. PATENT DOCUMENTS

| | | | |
|---|---|---|---|
| 2005/0282382 A1* | 12/2005 | Ko | H01L 21/02126 438/637 |
| 2008/0153296 A1* | 6/2008 | Li | H01L 21/31144 438/702 |
| 2012/0074571 A1* | 3/2012 | Lavoie | H01L 21/2855 257/751 |
| 2014/0227872 A1* | 8/2014 | Zhang | H01L 21/76807 438/667 |
| 2015/0380246 A1 | 12/2015 | Hu et al. | |

* cited by examiner

METHODS EMPLOYING SACRIFICIAL BARRIER LAYER FOR PROTECTION OF VIAS DURING TRENCH FORMATION

TECHNICAL FIELD

The present invention relates generally to methods for fabricating semiconductor devices, and more particularly, to methods employing sacrificial barrier layer for protection of vias during trench formation.

BACKGROUND OF THE DISCLOSURE

In modern semiconductor device fabrication, after the devices are created, for example, transistors, at the so-called "Front-End-Of-Line (FEOL)," electrical connections to the devices are made, also known as "metallization," at the so-called "Back-End-Of-Line (BEOL)." The metallization process includes filling various vias with a conductive material, typically, metal. However, at various points in via creation and metal filling, a number of defects can unintentionally be introduced, affecting the end-use reliability of the connections using the metal-filled vias.

SUMMARY OF THE DISCLOSURE

Shortcomings of the prior art are overcome and additional advantages are provided through the provision, in one embodiment, of a method which includes, for example, providing an intermediate semiconductor structure having a metallic layer, a patternable layer disposed over the metallic layer, and a hard mask disposed over the patternable layer, the intermediate semiconductor structure includes a plurality of vias extending through the hard mask onto the metallic layer, depositing a sacrificial barrier layer over the intermediate semiconductor structure and in the plurality of vias, removing a portion of the sacrificial barrier layer between the plurality of vias while maintaining a portion of the sacrificial barrier layer in the plurality of vias, forming a trench in the patternable layer between the removed portion of the sacrificial barrier layer and the plurality of vias, and removing the remaining portions of the sacrificial barrier layer from the plurality of vias.

In another embodiment, a method is provided, which includes, for example, providing an intermediate semiconductor structure having a metallic layer, a patternable layer disposed over the metallic layer, and a hard mask disposed over the patternable layer, the intermediate semiconductor structure includes a plurality of vias extending through the hard mask onto the metallic layer, depositing a sacrificial barrier layer over the intermediate semiconductor structure and in the plurality of vias to define a plurality of cavities in the vias, depositing a fill material over the sacrificial barrier layer and in a plurality of cavities defined by the sacrificial barrier layer in the plurality of vias, first removing a portion of the fill material and a portion of the sacrificial barrier layer between the plurality of vias while maintaining a portion of the sacrificial barrier layer and a portion of the fill material in the plurality of vias, forming a trench in the patternable layer between the removed portion of the sacrificial barrier layer and the plurality of vias, and second removing the remaining fill material and the remaining portions of the sacrificial barrier layer from the plurality of vias.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

As will be appreciated from the following description, the present description provides methods for protecting intermediate semiconductor structures during trench formation. In particular, the present disclosure provides methods for protecting vias, such as avoiding damage or chamfering of the vias, in intermediate semiconductor structures during trench formations such in electrical connections know as metallization at the so-called Back-End-Of-Line (BEOL). For example, the present disclosure may employ a non-reactive sacrificial barrier layer for protecting vias during trench formation and removal after trench formation compared to employing solely a reactive fill material in the vias during trench formation, which fill material for trench lithographs and patterning interacts with the intermediate semiconductor substrate such as with patternable material forming the vias and/or a conductive layer such as an M1 layer forming a bottom of the via during trench formation and removal.

By way of example, FIGS. 1-8 illustrate a method for fabricating conductive metal interconnect structures, such as trench openings while protecting vias, according to an embodiment of the present invention.

Figure 1:
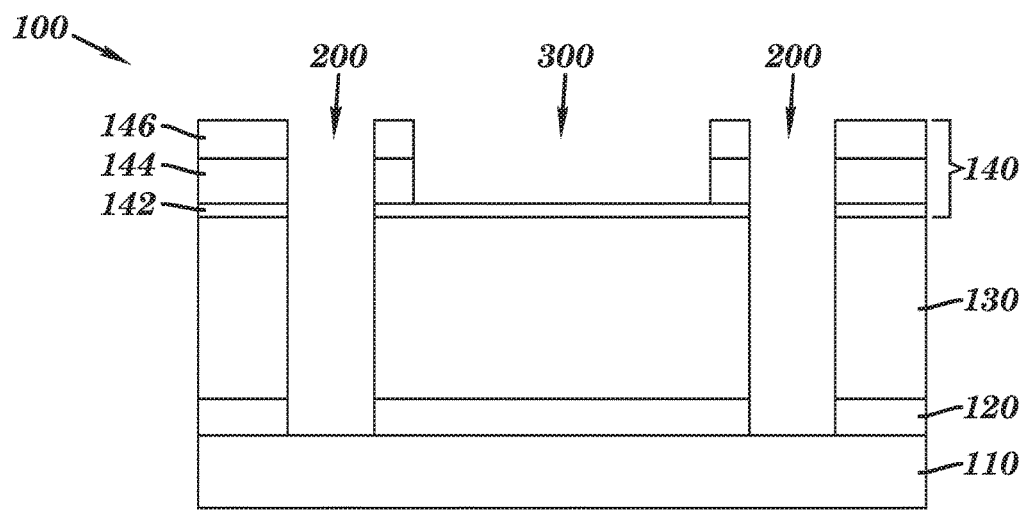
FIG. 1 is a cross-sectional view of an intermediate semiconductor structure according to an embodiment of the present disclosure.

FIG. 1 illustrates a cross-sectional view of an intermediate semiconductor structure 100 for one or more semiconductor devices. For example, illustrated intermediate semiconductor structure 100 may include a plurality of vias 200 and one or more trench patterning memorization 300 (only one of which is shown in FIG. 1). Intermediate semiconductor structure 100 may include an interconnecting conductive structure 110, dielectric cap layer 120, a patternable layer 130, and a hard mask layer 140 that may include a stack of a first protective layer or hard mask 142, a second protective layer or hard mask 144, and a third protective layer or hard mask 146.

Starting semiconductor structure 100 may be operable with individual devices which may be created during front-end of line (FEOL) processing, for instance, within a device layer (not shown in FIG. 1) disposed over a substrate (not shown in FIG. 1) such as a silicon substrate. As an example, the individual devices may include, for instance, metal-oxide-semiconductor field-effect transistors (MOSFETs) such as FinFETs, as well as capacitors, resistors and other semiconductor devices.

Interconnecting conductive structure 110 may be an M1 layer such as a copper layer. Dielectric cap layer 120 may be a nitrogen-doped silicon carbide (NBLOK) and may be deposited by plasma enhanced chemical vapor deposition (PECVD). Patternable layer 130 may be deposited from a gaseous phase using any suitable conventional deposition processes, for instance, chemical vapor deposition (CVD) or physical vapor deposition (PVD), or other suitable process. Patternable layer 130 may include a dielectric layer, in one example, or be fabricated of, for instance, an ultra-low-k dielectric material (e.g., the dielectric constant value being less than 2.7), or other suitable material.

First hard mask 142 may be a hard-mask deposited over patternable layer 130, and in one specific example, may include a nitride such as, for example, silicon nitride (SiN or SiNH). The deposition process may include any conventional process such as, for example, low temperature CVD or plasma-enhanced CVD. Second hard mask 144 may be fabricated of a metal or a metal-containing material such as, for example, include titanium (Ti) or titanium nitride (TiN). Third hard mask 146 may be a hard-mask deposited over patternable layer 130, and in one specific example, may include a nitride such as, for example, silicon nitride (SiN or SiNH).

Vias 200 and trench memorization 300 may be operably formed in intermediate semiconductor structure 100 using a lithograph stack and photoresist patterning, and etch processes. In addition, it will be appreciated that an intermediate semiconductor structure may in accordance with the present disclosure have other configurations and/or be fabricated from other material. Although only a portion is shown for simplicity, it will be understood that, in practice, many such components are typically included on the same substrate.

Figure 2:
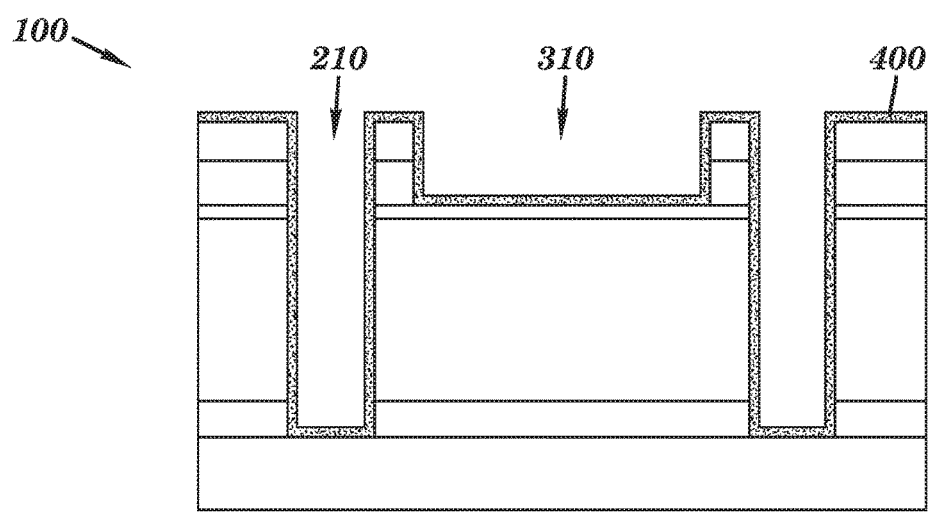
FIGS. 2-8 are cross-sectional views of a method for forming vias and trenches in the metallization phase of fabricating semiconductor devices according to an embodiment of the present disclosure.

As shown in FIG. 2, a sacrificial barrier layer 400 is disposed over intermediate semiconductor structure 100 according to an embodiment of the present disclosure. For example, sacrificial barrier layer 400 may form along the sidewalls of vias 200 and trench memorization 300. For example, sacrificial barrier layer 400 may define cavities 210 in vias 200, and cavities 310 in trench memorization 300. The sacrificial barrier layer may be non-reactive with the structure forming the vias, such as the hard mask, patternable layer, and the conductive layer. Any suitable material such as organic material or inorganic material may be employed. A suitable atomic layer deposition may include an aluminum nitride (AlN), titanium nitride (TiN), titanium (Ti), tantalum (Ta) tantalum nitride (TaN), cobalt (Co), or ruthenium (Ru). The cavities may have high aspect ratio such as a ratio between 4 to 1 to 12 to 1. The cavities may be about 120 nanometer in height, and about 20 nanometer in width.

Figure 3:
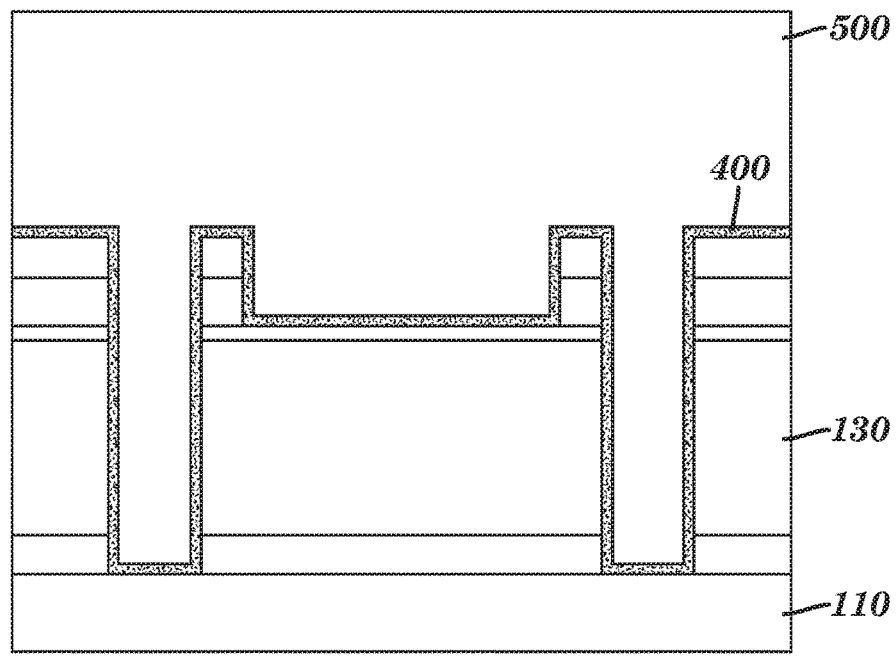

As shown in FIG. 3, a fill material 500 is deposed over liner 400 and into cavities 210 and 310. Sacrificial barrier layer 400 protects patternable layer 130 from interacting with fill material 500, e.g., fill material 500 does not penetrate into patternable layer 130. Sacrificial barrier layer 400 also protects interconnecting conductive structure 110 from interacting with fill material 500, e.g., fill material 500 does not penetrate into interconnecting conductive structure 110. In some embodiments of the present disclosure, a fill material need not be employed. For example, a fill material need not be fill in the cavities defined by the sacrificial barrier layer. However, benefits of employing a fill material include providing an additional barrier to the patternable layer and the interconnecting conductive structure during processing as described below.

Figure 4:
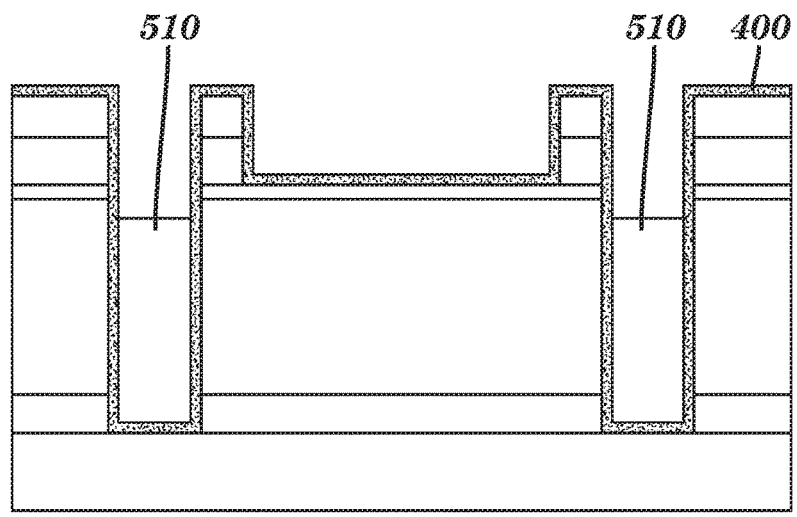

With reference to FIG. 4, an upper portion of fill material 500 (FIG. 3) is removed to expose areas of sacrificial barrier layer 400 such as over trench memorization 300 (FIG. 1) and cavity 310 (FIGS. 2 and 4) formed therein, while maintaining fill material portions 510 in portions of cavities 210 (FIG. 2) formed by the sacrificial barrier layer in the vias. Removal of the fill material may include plasma etching, wet etching, or a combination of plasma etching and wet etching. For example, a suitable etching may include carbon monoxide (CO), carbon dioxide (CO2), sulfur dioxide (SO2), oxygen (O2) for organics, and fluorocarbons, fluoro-nitrides for oxides. For example, suitable plasma etching gases may include nitrogen (N2), nitrogen/hydrogen (N2/H2), carbon tetrafluoride (CF4), perfluorocyclobutane (C4F8), and C5HF6. For example, a suitable wet etching chemistries may include hydrogen peroxide, hydrofluoric acid, ammonium hydroxide, or organic solvents.

Figure 5:
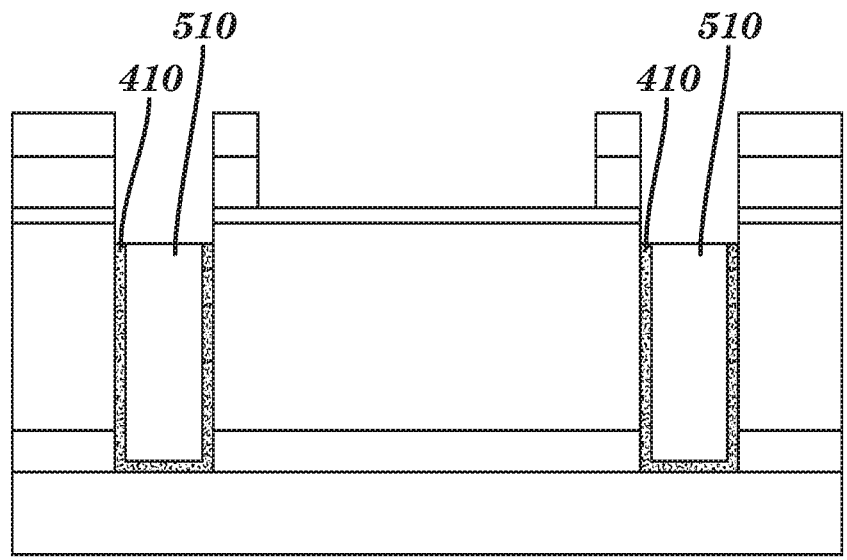

In FIG. 5, sacrificial barrier layer breakthrough is performed to remove portions of sacrificial barrier layer 400 (FIG. 4) corresponding to areas for forming trenches while maintaining sacrificial barrier layer portions 410 and fill material portions 510 in the cavities in the vias. For example, suitable selective etching may be employed which is operable to etch away the exposed sacrificial barrier layer while not etching the fill material. Fill material portions 510 protect sacrificial barrier layer portions 410 from the sacrificial barrier layer etching breakthrough.

Figure 6:
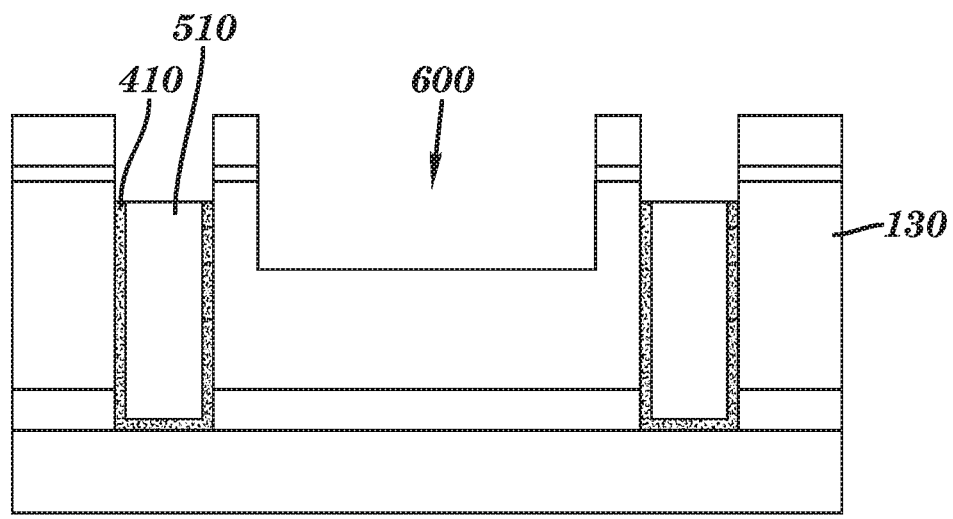

FIG. 6 illustrates the forming of trenches 600 in patternable layer 130 while maintaining sacrificial barrier layer portions 410 and fill material portions 510 in the cavities in the vias in cavities. Trench etch may include carbon tetrafluoride (CF4), nitrogen trifluoride (NF3), perfluorocyclobutane (C4F8), octafluorocyclopentene (C5F8), hexafluorobutadiene (C4F6), fluoromethane (CH3F), fluoroform (CHF3), and/or C5HF6, any combination of fluorocarbons, argon (Ar), nitrogen (N2), methane (CH4), carbon monoxide (CO), carbon dioxide (CO2).

Figure 7:
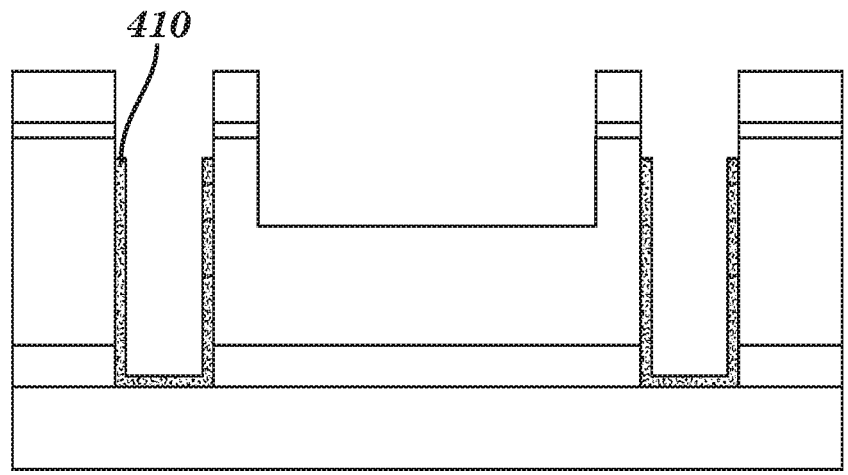

In FIG. 7, remaining fill material 510 (FIG. 6) is removed from remaining sacrificial barrier layer portions 410 in the vias. For example, removal may include using carbon monoxide (CO), carbon dioxide (CO2), sulfur dioxide (SO2), oxygen (O2) for organics, and fluorocarbons, fluoro-nitrides for oxides. For example, removal may include using a suitable plasma etching gas such as nitrogen (N2), and nitrogen/hydrogen (N2/H2).

Figure 8:
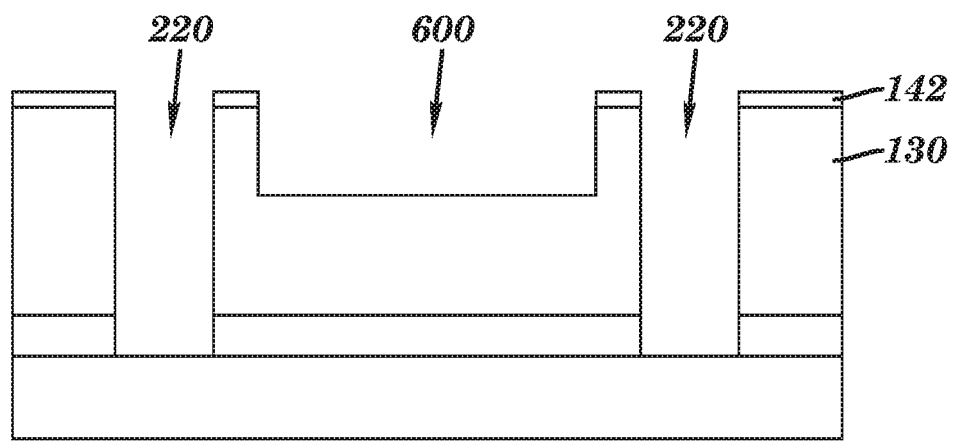

In FIG. 8, remaining sacrificial barrier layer portions 410 (FIG. 7) is removed. For example, using a wet TiN removal such as SC1 (mixture of hydrogen peroxide, ammonium hydroxide, deionized water), hydrofluoric acid, or mixture of hydrogen peroxide, quarternary ammonium hydroxide, deionized water. The filler material and the sacrificial barrier layer may be removed without or limiting damage to the vias, such as the hard mask, patternable layer, and the conductive layer. Thereafter, hard mask 142 and a top portion of patternable layer 130 may be removed such as by chemical mechanical polishing/planarization (CMP). For example, remaining sacrificial barrier layer portions 410 (FIG. 6) and remaining fill material 510 (FIG. 6) may be tuned in device development, e.g., upper portions of remaining sacrificial barrier layer portions 410 (FIG. 6) and remaining fill material 510 (FIG. 6) may be disposed at a height equal to or greater than the height of the top portion of patternable layer 130 after removal by CMP.

The remaining vias 220 may be filled with a conductive material such as a metal according to an embodiment of the present disclosure. The vias may be filled with, for example, tungsten, and the filling may be accomplished using one or more conventional processes and techniques. Trenches 600 may be filed with dielectric material according to an embodiment of the present disclosure, and the filling may be accomplished using one or more conventional processes and techniques. In other embodiments, the trenches may be filled with, for example, a conductive material such as tungsten (W), cobalt (Co), ruthenium (Ru), tantalum (Ta), and copper (Cu), and the filling may be accomplished using one or more conventional processes and techniques.

Figure 9:
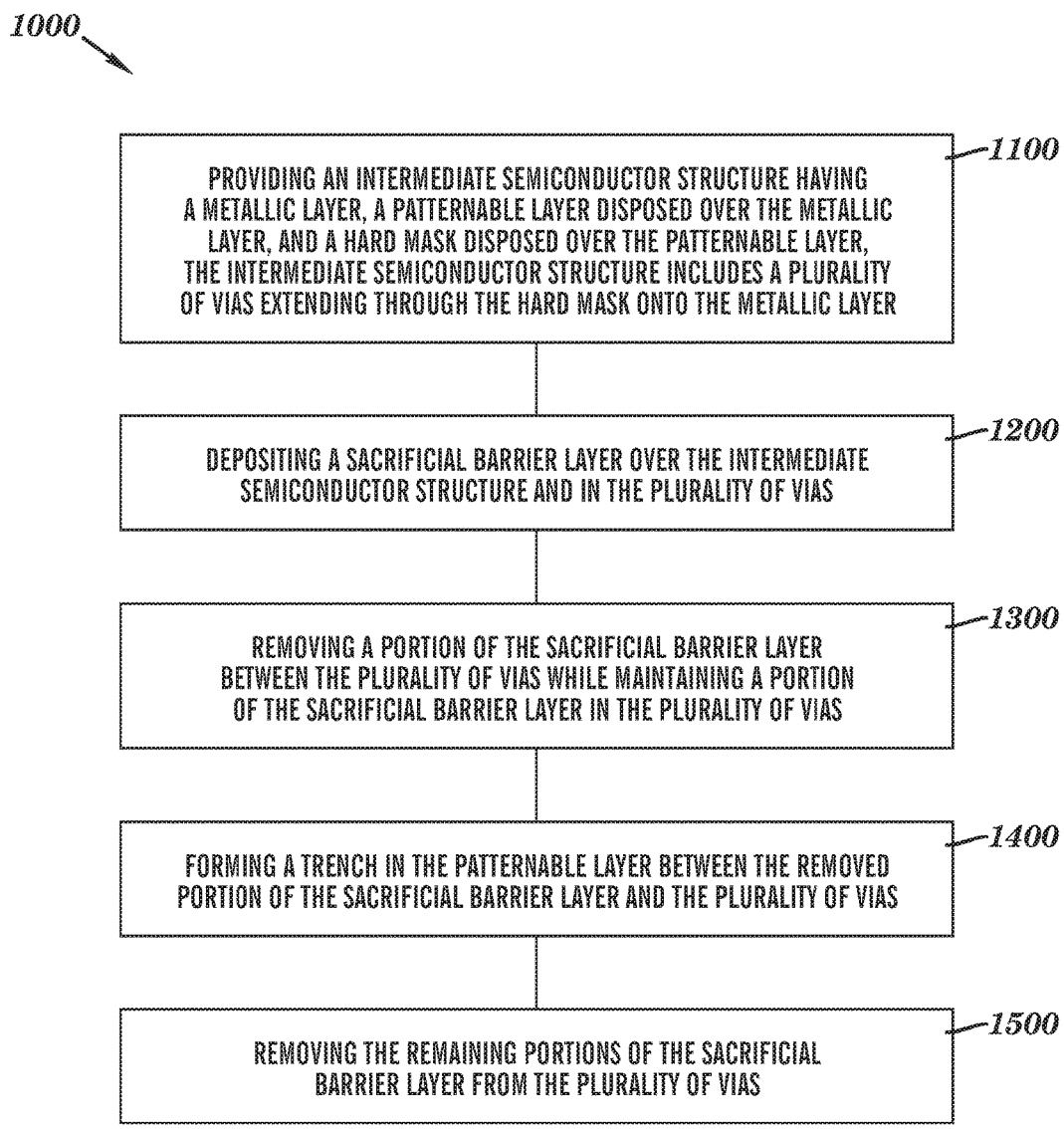
FIG. 9 is a flowchart illustrating a method according to an embodiment of the present disclosure.

FIG. 9 is a flowchart of a method 1000 according to an embodiment of the present disclosure. Method 1000 includes, for example, at 1100 providing an intermediate semiconductor structure having a metallic layer, a patternable layer disposed over the metallic layer, and a hard mask disposed over the patternable layer, the intermediate semiconductor structure includes a plurality of vias extending through the hard mask onto the metallic layer, at 1200 depositing a sacrificial barrier layer over the intermediate semiconductor structure and in the plurality of vias, at 1300 removing a portion of the sacrificial barrier layer between the plurality of vias while maintaining a portion of the sacrificial barrier layer in the plurality of vias, at 1400 forming a trench in the patternable layer between the removed portion of the sacrificial barrier layer and the plurality of vias, and at 1500 removing the remaining portions of the sacrificial barrier layer from the plurality of vias.

Figure 10:
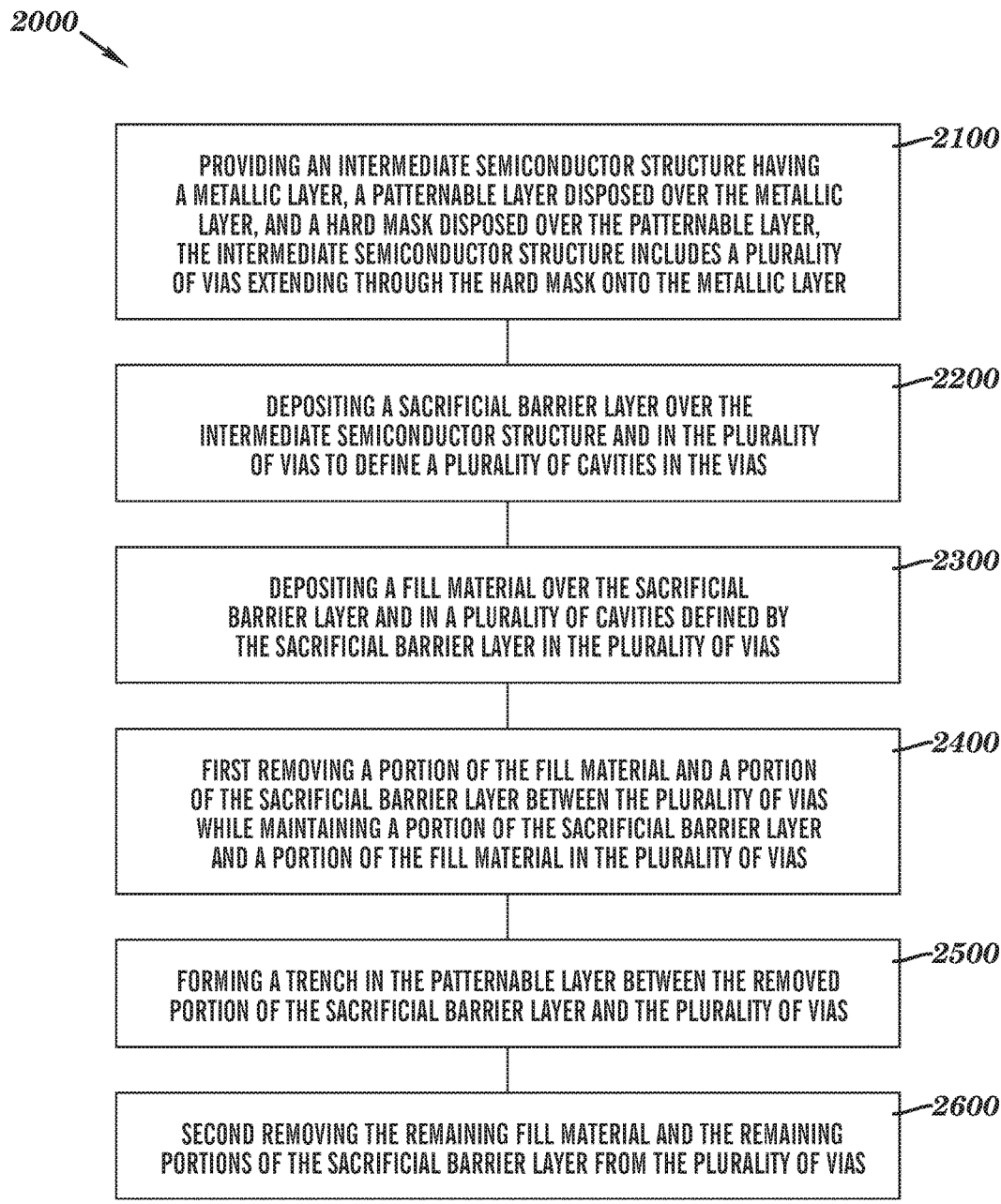
FIG. 10 is a flowchart illustrating a method according to an embodiment of the present disclosure.

FIG. 10 is a flowchart of a method 2000 according to an embodiment of the present disclosure. Method 2000 includes, for example, at 2100 providing an intermediate semiconductor structure having a metallic layer, a patternable layer disposed over the metallic layer, and a hard mask disposed over the patternable layer, the intermediate semiconductor structure includes a plurality of vias extending through the hard mask onto the metallic layer, at 2200 depositing a sacrificial barrier layer over the intermediate semiconductor structure and in the plurality of vias to define a plurality of cavities in the vias, at 2300 depositing a fill material over the sacrificial barrier layer and in a plurality of cavities defined by the sacrificial barrier layer in the plurality of vias, at 2400 first removing a portion of the fill material and a portion of the sacrificial barrier layer between the plurality of vias while maintaining a portion of the sacrificial barrier layer and a portion of the fill material in the plurality of vias, at 2500 forming a trench in the patternable layer between the removed portion of the sacrificial barrier layer and the plurality of vias, and at 2600 second removing the remaining fill material and the remaining portions of the sacrificial barrier layer from the plurality of vias.

From the present disclosure, it will be appreciated that the vias formed employing the sacrificial barrier layer may be non-reactive with the structure forming the sacrificial barrier layer may have a straight profile and not chamfered sides. For example, the present disclosure may result in protection of an ultra-low dielectric patternable layer during trench open of the patternable layer as well as protection of a conductive layer such as tungsten (W), cobalt (Co), or copper (Cu). The present disclosure may result in providing advantages for better via profile to reach time-dependent dielectric breakdown (TDDB) targets, or e.g., minimize time-dependent gate oxide breakdown in MOSFETs, when the gate oxide breaks down. For example, a sacrificial barrier layer may be a TiN liner conformally deposited in the vias and on the hard mask materials. The present process may increase the process window or robustness of the manufacturing process to remove fill material without damaging the patternable layer for trench formation. The present process may employ a wet removable liner or sacrificial barrier layer after fill removal that uses same POR wet chemistry (fully integrated with POR wet process flow).

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:
1. A method comprising:
 providing an intermediate semiconductor structure comprising an interconnecting conductive structure, a dielectric layer and a patternable layer disposed over the interconnecting conductive structure, and a hard mask disposed over the patternable layer, the intermediate semiconductor structure comprising a plurality of vias extending through the hard mask, the patternable layer, the dielectric layer, and opening directly onto the interconnecting conductive structure;

depositing a sacrificial barrier layer over the intermediate semiconductor structure and in the plurality of vias and directly on the interconnecting conductive structure;

first removing an upper portion of the sacrificial barrier layer between the plurality of vias while maintaining a lower portion of the sacrificial barrier layer directly on the interconnecting conductive structure in the plurality of vias;

forming a trench in the patternable layer between the removed portion of the sacrificial barrier layer and the plurality of vias while maintaining the lower portion of the sacrificial barrier layer directly on the interconnecting conductive structure in the plurality of vias; and second removing the remaining lower portions of the sacrificial barrier layer from the plurality of vias to expose the interconnecting conductive structure at the bottom of the vias.

2. The method of claim 1 wherein the sacrificial barrier layer is non-reactive with patternable layer forming sides of the plurality of vias.

3. The method of claim 1 wherein the sacrificial barrier layer is non-reactive with the interconnecting conductive structure.

4. The method of claim 1 wherein the sacrificial barrier layer is non-reactive with the forming the trench in the patternable layer.

5. The method of claim 1 wherein a spacing between one of the plurality of vias and the trench is less than about 20 nanometers.

6. The method of claim 1 wherein the sacrificial barrier layer comprises an atomic layer deposition (ALD).

7. The method of claim 1 wherein the sacrificial barrier layer comprises AlN or TiN.

8. The method of claim 7 wherein the removing portions of the sacrificial barrier layer comprises removing portions of the sacrificial barrier layer corresponding to the trench patterning memorization.

9. The method of claim 1 wherein the multilayer stack structure comprises a trench patterning memorization corresponding to the trench.

10. The method of claim 1 wherein the forming the trenches comprises etching.

11. The method of claim 1 further comprising filling the plurality of vias in the patternable layer with a conductive material.

12. The method of claim 1 further comprising filling the trench in the patternable layer with a conductive or non-conductive material.

13. The method of claim 1 wherein:
the depositing comprises depositing a fill material over the sacrificial barrier layer and in a plurality of cavities defined by the sacrificial barrier layer in the plurality of vias;
the first removing comprises removing a portion of the fill material and the portion of the sacrificial barrier layer between the plurality of vias while maintaining a portion of the sacrificial barrier layer and a portion of the fill material in the plurality of vias; and
the second removing comprises removing the remaining fill material and the remaining portions of the sacrificial barrier layer from the plurality of vias.

14. The method of claim 13 wherein the sacrificial barrier layer is non-reactive with patternable layer forming sides of the plurality of vias.

15. The method of claim 13 wherein the sacrificial barrier layer is non-reactive with the interconnecting conductive structure.

16. The method of claim 13 wherein the sacrificial barrier layer is non-reactive with the forming the trench in the patternable layer.

17. The method of claim 13 wherein the sacrificial barrier layer comprises an atomic layer deposition (ALD).

18. The method of claim 17 wherein the sacrificial barrier layer comprises AlN or TiN.

19. The method of claim 13 wherein a distance from the via to the trench is less than about 20 nanometers.

20. The method of claim 13 further comprising filling in the plurality of vias with a conductive material and filling the trenches with a dielectric or a conductive material.

* * * * *